United States Patent
Jo

(10) Patent No.: US 7,453,383 B2
(45) Date of Patent: Nov. 18, 2008

(54) DIGITAL-TO-ANALOG CONVERTING CIRCUIT, ELECTROOPTICAL DEVICE, AND ELECTRONIC APPARATUS

(75) Inventor: Hiroaki Jo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 457 days.

(21) Appl. No.: 11/235,127

(22) Filed: Sep. 27, 2005

(65) Prior Publication Data

US 2006/0017589 A1    Jan. 26, 2006

Related U.S. Application Data

(63) Continuation of application No. 10/878,548, filed on Jun. 29, 2004, now Pat. No. 7,006,026.

(30) Foreign Application Priority Data

| Jul. 7, 2003 | (JP) | 2003-193106 |
| May 11, 2004 | (JP) | 2004-141116 |

(51) Int. Cl.
*H03M 1/66* (2006.01)

(52) U.S. Cl. .......................... 341/144; 345/98; 345/87; 345/204

(58) Field of Classification Search ................ 341/144, 341/135, 13; 315/365; 600/547; 349/161; 345/87, 82, 98, 204
See application file for complete search history.

(56) References Cited

U.S. PATENT DOCUMENTS

| 3,877,023 | A | 4/1975 | Spicer et al. ................. 341/118 |
| 4,450,518 | A | 5/1984 | Klee ............................. 700/78 |
| 4,972,188 | A | 11/1990 | Clement et al. ............. 341/118 |
| 5,204,589 | A | 4/1993 | Koblitz ........................ 315/364 |
| 5,257,027 | A | 10/1993 | Murota ........................ 341/153 |
| 5,369,406 | A | 11/1994 | Hughes ....................... 341/135 |
| 5,642,300 | A | 6/1997 | Gubisch et al. |
| 5,880,689 | A | 3/1999 | Kushner ...................... 341/144 |
| 5,943,000 | A | 8/1999 | Nessi et al. .................. 341/154 |
| 6,038,470 | A | 3/2000 | Ploetz et al. ................. 600/547 |
| 6,100,868 | A * | 8/2000 | Jeong et al. ................... 345/98 |
| 6,111,630 | A * | 8/2000 | Watanuki et al. ............ 349/161 |
| 6,144,354 | A | 11/2000 | Koyama et al. ............... 345/98 |
| 6,154,121 | A * | 11/2000 | Cairns et al. ................. 341/138 |
| 6,191,779 | B1 * | 2/2001 | Taguchi et al. .............. 345/204 |
| 6,340,939 | B1 | 1/2002 | Dedic ........................... 341/136 |

(Continued)

FOREIGN PATENT DOCUMENTS

| CN | 1335682 A | 2/2002 |
| JP | A 11-330966 | 11/1999 |
| JP | A 2000-122608 | 4/2000 |
| JP | A 2002-026732 | 1/2002 |
| JP | A-2003-43993 | 2/2003 |
| JP | A 2003-308044 | 10/2003 |

*Primary Examiner*—Jean B Jeanglaude
(74) *Attorney, Agent, or Firm*—Oliff & Berridge, PLC

(57) ABSTRACT

A digital-to-analog converting circuit is provided that is capable of, after converting digital data into an analog current, correcting the current value based on digital current correction data without any complex processing. The exemplary digital-to-analog converting circuit can include a first digital-to-analog converting circuit portion and a second digital-to-analog converting circuit portion. First digital data (image data) can input to the first digital-to-analog converting circuit portion, and second digital data (current correction data) can input to the second digital-to-analog converting circuit portion. After the first digital-to-analog converting circuit portion converts the image data into a first analog current, the second digital-to-analog converting circuit portion can correct the first analog current based on the current correction data, and outputs the corrected current as a second analog current.

9 Claims, 10 Drawing Sheets

U.S. PATENT DOCUMENTS

| | | | |
|---|---|---|---|
| 6,380,920 B1 | 4/2002 | Ozawa | 345/100 |
| 6,452,526 B2 | 9/2002 | Sagawa et al. | 341/144 |
| 6,556,162 B2 | 4/2003 | Brownlow et al. | |
| 6,639,534 B2 | 10/2003 | Khoini-Poorfard et al. | 341/144 |
| 6,674,377 B1 | 1/2004 | Li | 341/120 |
| 2002/0011978 A1* | 1/2002 | Yamazaki et al. | 345/87 |
| 2002/0033783 A1* | 3/2002 | Koyama | 345/82 |
| 2002/0135314 A1 | 9/2002 | Kitahara et al. | |

* cited by examiner

| INPUT GRAYSCALE DATA | OUTPUT GRAYSCALE DATA | INPUT GRAYSCALE DATA | OUTPUT GRAYSCALE DATA |
|---|---|---|---|
| 0 | 0 | 16 | 64 |
| 1 | 1 | 17 | 72 |
| 2 | 2 | 18 | 81 |
| 3 | 3 | 19 | 91 |
| 4 | 4 | 20 | 101 |
| 5 | 6 | 21 | 112 |
| 6 | 9 | 22 | 124 |
| 7 | 12 | 23 | 136 |
| 8 | 16 | 24 | 149 |
| 9 | 20 | 25 | 162 |
| 10 | 24 | 26 | 176 |
| 11 | 30 | 27 | 191 |
| 12 | 35 | 28 | 206 |
| 13 | 42 | 29 | 222 |
| 14 | 48 | 30 | 239 |
| 15 | 56 | 31 | 255 |

DIGITAL-TO-ANALOG CONVERTING CIRCUIT, ELECTROOPTICAL DEVICE, AND ELECTRONIC APPARATUS

This is a Continuation of application Ser. No. 10/878,548 filed Jun. 29, 2004 now U.S. Pat. No. 7,006,026. The entire disclosure of the prior application is hereby incorporated by reference herein in its entirety.

BACKGROUND OF THE INVENTION

1. Field of Invention

Aspects of the invention relates to a digital-to-analog converting circuit, an electrooptical device, and an electronic apparatus.

2. Description of Related Art

Digital-to-analog converting circuits are used in a variety of electronic apparatuses. For example, a digital-to-analog converting circuit can be used in a data line driving circuit of an organic electroluminescent display device, which is one type of electrooptical device. The digital-to-analog converting circuit for use in the data line driving circuit supplies an analog current corresponding to digital image data (grayscale data) to pixel circuits via data lines. See, for example, Japanese Unexamined Patent Application Publication No. 2000-122608.

SUMMARY OF THE INVENTION

In such an organic electroluminescent display device, the digital image data supplied to the digital-to-analog converting circuit in the data line driving circuit is grayscale data that has been converted into data having a gamma characteristic by a signal generating circuit. More specifically, the signal generating circuit converts, for example, 5-bit digital image data into, for example, 8-bit digital image data having a gamma characteristic, and then outputs the converted image data to the data line driving circuit.

In some cases, the organic electroluminescent display device requires conversion into data having a gamma characteristic, and also requires correction for the luminance of organic electroluminescent elements in the pixel circuits. In such cases, if the digital image data is also to be corrected in the signal generating circuit, a complex signal generating circuit is required, and the signal generating circuit has a heavy load, which is substantially difficult to realize.

An aspect of the invention can provide a digital-to-analog converting circuit capable of readily correcting an analog current converted by digital-to-analog conversion with a simple circuit configuration, an electrooptical device, and an electronic apparatus.

An exemplary digital-to-analog converting circuit according to the invention is a digital-to-analog converting circuit for converting digital data into analog current, including a first digital-to-analog converting circuit portion that receives first digital data and that converts the first digital data into a first analog current, and a second digital-to-analog converting circuit portion that receives second digital data and that corrects the first analog current based on the second digital data to output a second analog current. Therefore, the provision of the second digital-to-analog converting circuit portion allows the first analog current of the first digital-to-analog converting circuit portion to be corrected based on the second digital data without any complex pre-processing.

In this digital-to-analog converting circuit, the first digital-to-analog converting circuit portion may include a first diode-connected transistor having a first control terminal, a plurality of second transistors each having a second control terminal, the second control terminals being connected to the first control terminal, a plurality of third transistors having third control terminals that are connected to a plurality of signal lines for receiving the first digital data, the plurality of third transistors being connected in series to the plurality of second transistors, and a first current path for, when the plurality of third transistors are turned on by the first digital data, outputting the current output from the corresponding second transistors from a first output terminal to the second digital-to-analog converting circuit portion as the first analog current. Accordingly, the first digital-to-analog converting circuit portion outputs a first analog current in proportion to the first digital data input, and can therefore output the first digital data having a gamma characteristic as the first analog current while maintaining the gamma characteristic.

In this digital-to-analog converting circuit, the second digital-to-analog converting circuit portion may include a fourth diode-connected transistor having a fourth control terminal, which receives the first analog current output from the first digital-to-analog converting circuit portion, a plurality of fifth transistors each having a fifth control terminal, the fifth control terminals being connected to the fourth control terminal, a plurality of sixth transistors having sixth control terminals that are connected to a plurality of signal lines for receiving the second digital data, the plurality of sixth transistors being connected in series to the plurality of fifth transistors, and a second current path for, when the plurality of sixth transistors are turned on by the second digital data, outputting the current output from the corresponding fifth transistors from a second output terminal as the second analog current. Therefore, the fourth transistor and each of the plurality of fifth transistors constitute a current mirror circuit, thus allowing the first analog current converted from the first digital data to be readily corrected to output the corrected first analog current as a second analog current.

In this digital-to-analog converting circuit, the second digital-to-analog converting circuit portion may further include a first capacitor connected to the fourth control terminal of the fourth transistor for holding a voltage across the fourth control terminal based on the first analog current, a seventh transistor having a seventh control terminal, which is turned on to supply the first analog current to the fourth transistor when a control signal is input to the seventh control terminal, and an eighth transistor having an eighth control terminal, which is turned on to diode-connect the fourth transistor when a control signal is input to the eighth control terminal. Therefore, the first capacitor disposed in the second digital-to-analog converting circuit portion holds the voltage corresponding to the second analog current to be output, thus allowing a single digital-to-analog converting circuit portion to be shared with a plurality of second digital-to-analog converting circuit portions. Thus, the number of first digital-to-analog converting circuit portions that require a relatively large space can be reduced.

In this digital-to-analog converting circuit, the second digital-to-analog converting circuit portion may include a plurality of ninth transistors each having a ninth control terminal, which receive the first analog current output from the first digital-to-analog converting circuit portion when the plurality of ninth transistors are diode-connected, a plurality of tenth transistors having tenth control terminals that are connected to a plurality of signal lines for receiving the second digital data, the plurality of tenth transistors being connected in series to the plurality of ninth transistors, a second current path for, when the plurality of tenth transistors are turned on by the second digital data, outputting the current output from the corresponding ninth transistors from a second output terminal as the second analog current, a plurality of second capacitors respectively connected to the ninth control terminals of the plurality of ninth transistors for holding a voltage across the ninth control terminals based on the first analog current, an eleventh transistor having an eleventh control terminal, which is turned on to supply the first analog current to the plurality of ninth transistors when a control signal is input to the eleventh control terminal, and a plurality of twelfth transistors each having a twelfth control terminal, which are turned on to diode-connect the plurality of ninth transistors when a control signal is input to the twelfth control terminal. Therefore, the second capacitor disposed in the second digital-to-analog converting circuit portion holds the voltage corresponding to the second analog current to be output, thus allowing a single digital-to-analog converting circuit portion to be shared with a plurality of second digital-to-analog converting circuit portions. Thus, the number of first digital-to-analog converting circuit portions that require a relatively large space can be reduced.

An exemplary electrooptical device according to the invention can include a plurality of scanning lines, a plurality of data lines, electrooptical elements disposed at intersections of the scanning lines and the data lines, and a data line driving circuit that supplies an analog current to the data lines. The data line driving circuit includes a first digital-to-analog converting circuit portion that receives first digital data and that converts the first digital data into a first analog current, and a second digital-to-analog converting circuit portion that receives second digital data and that processes the first analog current based on the second digital data to output a second analog current. Therefore, the digital-to-analog converting circuit includes the second digital-to-analog converting circuit portion, thus allowing the luminescence intensity of the electrooptical device to be corrected for based on the second digital data without any complex pre-processing.

In this electrooptical device, the first digital-to-analog converting circuit portion may include a first diode-connected transistor having a first control terminal, a plurality of second transistors each having a second control terminal, the second control terminals being connected to the first control terminal, a plurality of third transistors having third control terminals that are connected to a plurality of signal lines for receiving the first digital data, the plurality of third transistors being connected in series to the plurality of second transistors, and a first current path for, when the plurality of third transistors are turned on by the first digital data, outputting the current output from the corresponding second transistors from a first output terminal to the second digital-to-analog converting circuit portion as the first analog current. Accordingly, the digital-to-analog converting circuit portion disposed in the data line driving circuit of the electrooptical device outputs a first analog current in proportion to the first digital data input, and can therefore output grayscale data, which is the first digital data having a gamma characteristic, as the first analog grayscale data while maintaining the gamma characteristic.

In this electrooptical device, the second digital-to-analog converting circuit portion may include a fourth diode-connected transistor having a fourth control terminal, which receives the first analog current output from the first digital-to-analog converting circuit portion, a plurality of fifth transistors each having a fifth control terminal, the fifth control terminals being connected to the fourth control terminal, a plurality of sixth transistors having sixth control terminals that are connected to a plurality of signal lines for receiving the second digital data, the plurality of sixth transistors being connected in series to the plurality of fifth transistors, and a second current path for, when the plurality of sixth transistors are turned on by the second digital data, outputting the current output from the corresponding fifth transistors from a second output terminal as the second analog current. Therefore, the fourth transistor and each of the plurality of fifth transistors constitute a current mirror circuit, thus allowing the first analog current converted from the first digital data to be readily corrected to output the corrected first analog current as a second analog current.

In this electrooptical device, the second digital-to-analog converting circuit portion may further include a first capacitor connected to the fourth control terminal of the fourth transistor for holding a voltage across the fourth control terminal based on the first analog current, a seventh transistor having a seventh control terminal, which is turned on to supply the first analog current to the fourth transistor when a control signal is input to the seventh control terminal, and an eighth transistor having an eighth control terminal, which is turned on to diode-connect the fourth transistor when a control signal is input to the eighth control terminal. Therefore, the first capacitor disposed in the second digital-to-analog converting circuit portion of the data line driving circuit holds the voltage corresponding to the second analog current to be output, thus allowing a single first digital-to-analog converting circuit portion to be shared with a plurality of second digital-to-analog converting circuit portions. This reduces the number of first digital-to-analog converting circuit portions that require a relatively large space, while simplifying the structure of the data line driving circuit and reducing the size of the device.

In this electrooptical device, the second digital-to-analog converting circuit portion may include a plurality of ninth transistors each having a ninth control terminal, which receive the first analog current output from the first digital-to-analog converting circuit portion when the plurality of ninth transistors are diode-connected, a plurality of tenth transistors having tenth control terminals that are connected to a plurality of signal lines for receiving the second digital data, the plurality of tenth transistors being connected in series to the plurality of ninth transistors, a second current path for, when the plurality of tenth transistors are turned on by the second digital data, outputting the current output from the corresponding ninth transistors from a second output terminal as the second analog current, a plurality of second capacitors respectively connected to the ninth control terminals of the plurality of ninth transistors for holding a voltage across the ninth control terminals based on the first analog current, an eleventh transistor having an eleventh control terminal, which is turned on to supply the first analog current to the plurality of ninth transistors when a control signal is input to the eleventh control terminal, a plurality of twelfth transistors each having a twelfth control terminal, which are turned on to diode-connect the plurality of ninth transistors when a control signal is input to the twelfth control terminals. Therefore, the second capacitor disposed in the second digital-to-analog converting circuit portion of the data line driving circuit holds the voltage corresponding to the second analog current to be output, thus allowing a single first digital-to-analog converting circuit portion to be shared with a plurality of second digital-to-analog converting circuit portions. This can reduce the number of first digital-to-analog converting circuit portions that require a relatively large space, while simplifying the structure of the data line driving circuit and reducing the size of the device.

In this electrooptical device, the first digital data may be digital grayscale data based on image data, and the second digital data may be digital correction data based on at least one of an operating state and operating environment of the electrooptical device and a control signal from an external device. Therefore, digital grayscale data based on image data is corrected by digital correction data that is determined based on at least one of the operating state and operating environment of the electrooptical device and the control signal from an external device, thus achieving the optimum luminescence intensity depending upon the circumstance.

The electrooptical device may further include a detection sensor that detects at least one of the operating state and operating environment of the electrooptical device, and a control circuit that determines the at least one of the operating state and operating environment of the electrooptical device based on a detection signal from the detection sensor and that produces digital correction data based on a determination result. Therefore, the digital correction data is determined based on the operating state or operating environment of the electrooptical device detected by the detection sensor, thus achieving the optimum luminescence intensity depending upon the circumstance.

In this electrooptical device, the detection sensor may include at least one of a temperature sensor, an ambient light sensor, and a deterioration sensor. Therefore, correction is possible so as to obtain the optimum luminance depending upon the ambient temperature or ambient luminance of the electrooptical device or the deterioration level of a light-emitting element.

In this electrooptical device, the first digital data may be digital grayscale data based on image data, and the second digital data may be digital correction data based on a total luminance for one frame that is determined based on the image data. Therefore, the optimum luminescence intensity can be obtained based on the total luminance for one frame.

The electrooptical device may include a memory that stores image data for one frame, and a control circuit that determines the total luminance for one frame from the image data for one frame stored in the memory and that produces digital correction data based on the determined total luminance for one frame. Therefore, the optimum luminescence intensity can be obtained based on the total luminance for one frame.

In this electrooptical device, the control circuit may receive the image data, and may convert the received image data into digital grayscale data having a gamma characteristic. Therefore, the electrooptical device can provide accurate color reproduction of input image data for display.

An electronic apparatus according to the invention includes the electrooptical device described above. Therefore, the luminance of the electrooptical device can be corrected based on the second digital data without any complex pre-processing.

BRIEF DESCRIPTION OF THE DRAWINGS

This invention will be described with reference to the accompanying drawings, wherein like numerals reference like elements, and wherein.

DETAILED DESCRIPTION OF PREFERRED EMBODIMENTS

A first exemplary embodiment of the invention will now be described with reference to FIGS. 1 to 7.

Figure 1:
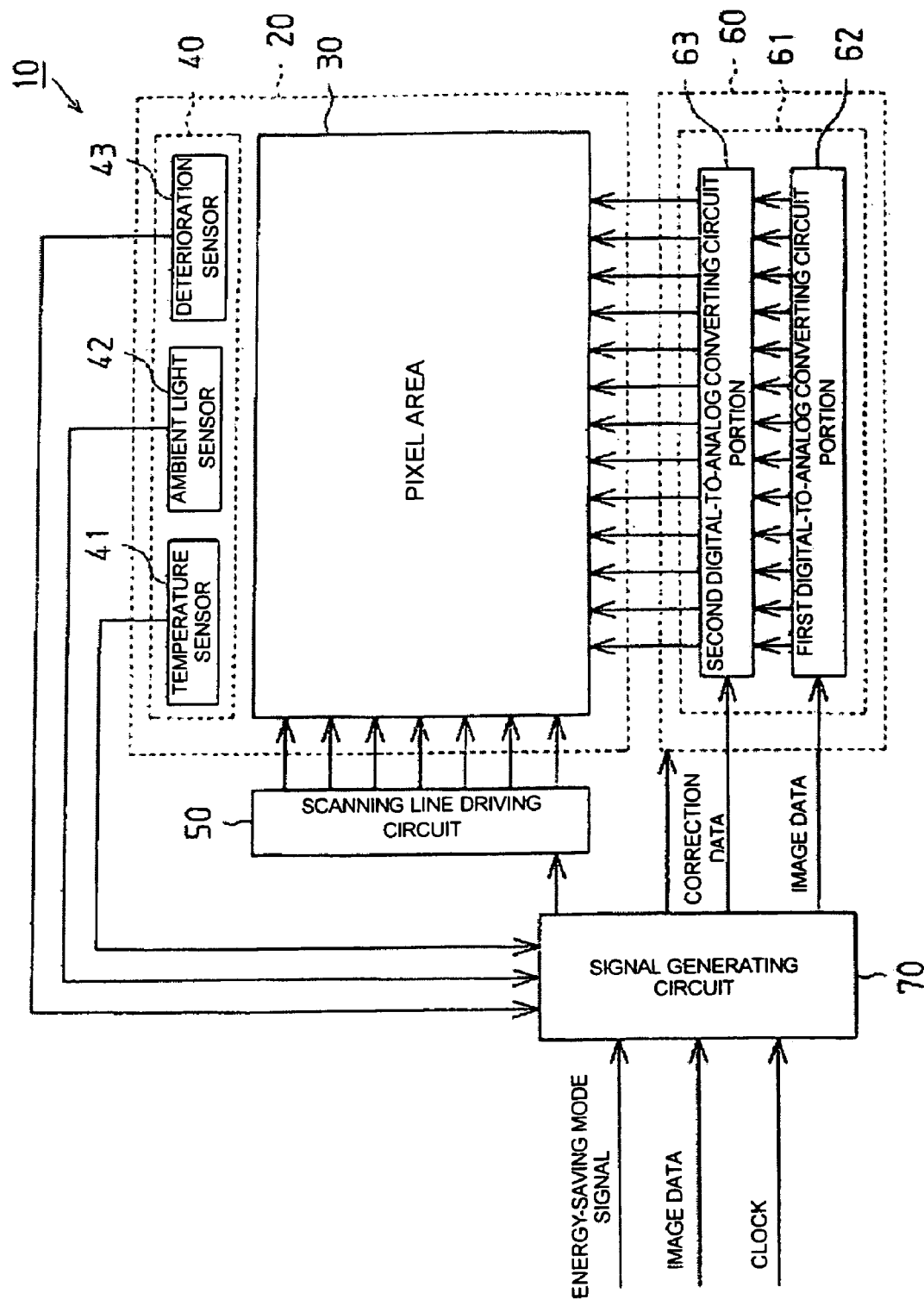
FIG. 1 is an exemplary block diagram showing the circuit structure of an organic electroluminescent display device according to an embodiment of the invention.

FIG. 1 is an exemplary block diagram showing the circuit structure of an organic electroluminescent display device serving as an electrooptical device. An organic electroluminescent display device 10 can include a display panel 20 that displays an image, and the display panel 20 includes a pixel area 30 having a matrix of organic electroluminescent elements. The display panel 20 further can include a detection area 40, and the detection area 40 includes detection sensors, that is, a temperature sensor 41, an ambient light sensor 42, and a deterioration sensor 43.

The organic electroluminescent display device 10 further can include a scanning line driving circuit 50 that drives scanning lines in the pixel area 30, and a data line driving circuit 60 that drives data lines in the pixel area 30. The data line driving circuit 60 includes a digital-to-analog converting circuit 61, and the digital-to-analog converting circuit 61 includes a first digital-to-analog converting circuit portion 62 and a second digital-to-analog converting circuit portion 63.

The organic electroluminescent display device 10 can further include a signal generating circuit 70 serving as a control circuit. The signal generating circuit 70 generates various signals to be sent to the scanning line driving circuit 50 and the data line driving circuit 60 based on various signals from external devices, image data, clocks, and signals from the sensors 41 to 43.

Each of the display panel 20, the scanning line driving circuit 50, the data line driving circuit 60, and the signal generating circuit 70 of the organic electroluminescent display device 10 may be an independent component (e.g., a single semiconductor integrated circuit device chip). A portion of or the entirety of the display panel 20, the scanning line driving circuit 50, the data line driving circuit 60, and the signal generating circuit 70 may be integrated into a component. For example, the scanning line driving circuit 50 and the data line driving circuit 60 may be integrally incorporated into the display panel 20. Alternatively, a portion of or the entirety of the scanning line driving circuit 50, the data line driving circuit 60, and the signal generating circuit 70 may be composed of a programmable IC chip, whose functions are implemented in software by a program described in the IC chip. The sensors 41 to 43 are not necessarily disposed on the display panel 20, and may be disposed in any other place.

Figure 2:
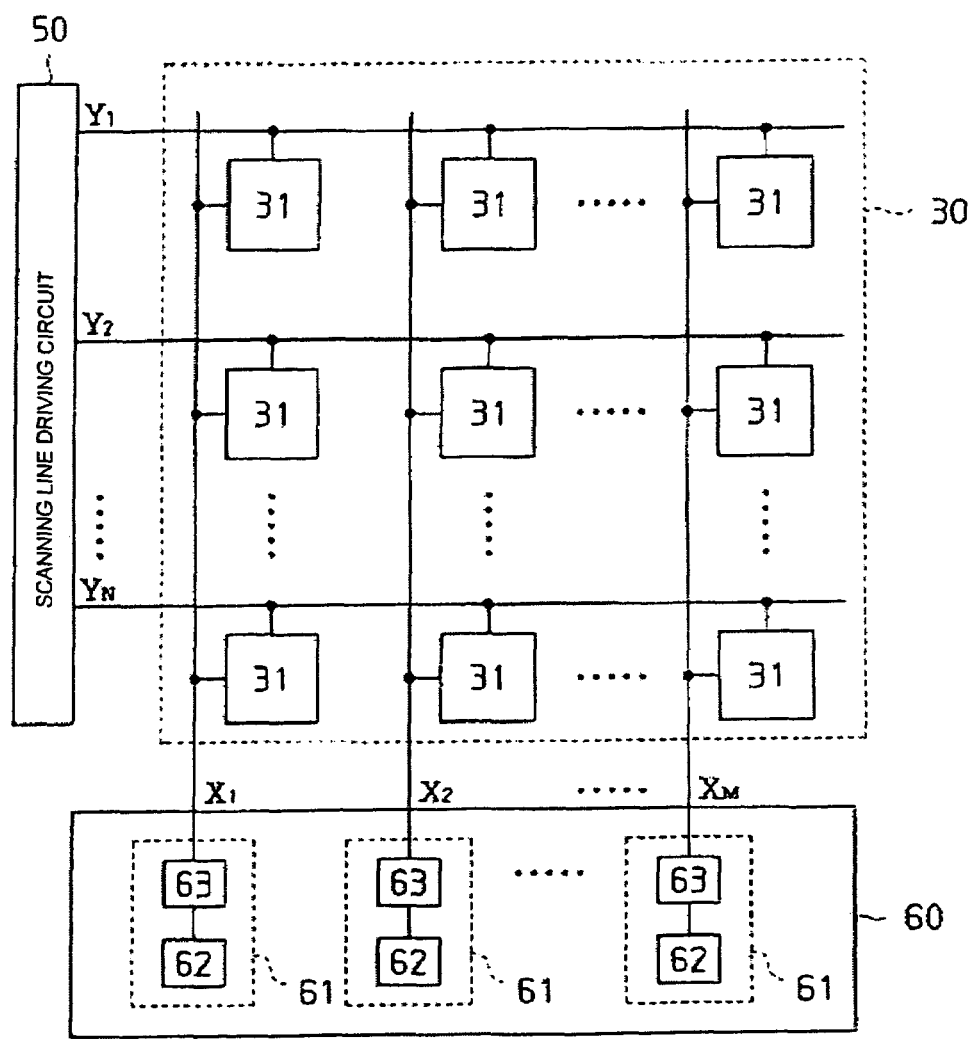
FIG. 2 is an exemplary circuit diagram showing the circuit structure of a pixel area.

FIG. 2 is an exemplary circuit diagram showing the internal structure of the pixel area 30. The pixel area 30 has a plurality of pixel circuits 31 that are arranged into a matrix, and each pixel circuit 31 has an organic electroluminescent element serving as an electrooptical element. The pixel circuits 31 are disposed at intersections of a plurality of data lines Xm (m=1 to M) extending in the column direction and a plurality of scanning lines Yn (n=1 to N) extending in the row direction, and are connected to these lines. Throughout this document, the pixel circuits 31 are also referred to as "pixels".

The scanning line driving circuit 50 selectively drives one of the plurality of scanning lines Yn to select a pixel circuit set for one row. The data line driving circuit 60 includes a plurality of digital-to-analog converting circuits 61 corresponding to the plurality of data lines Xm. The data line driving circuit 60 supplies a data signal to the pixel circuits 31 in the selected pixel circuit set via the data lines Xm.

Figure 3:
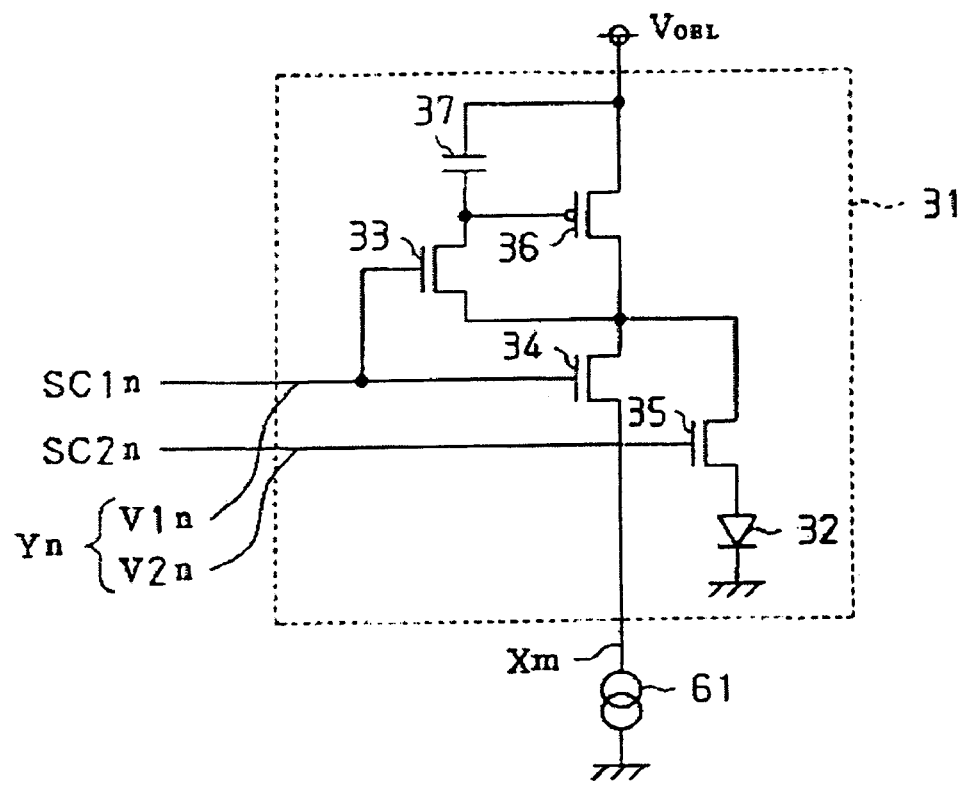
FIG. 3 is an exemplary circuit diagram showing the internal structure of a pixel circuit.

FIG. 3 is an exemplary circuit diagram showing the internal structure of each pixel circuit 31. The pixel circuit 31 includes an organic electroluminescent element 32, first to fourth transistors 33 to 36, and a holding capacitor 37. The holding capacitor 37 holds an electric charge corresponding to the data signal (analog current) supplied via the data line Xm to thereby adjust the luminescence intensity of the organic electroluminescent element 32. The first to third transistors 33 to 35 are n-channel FETs, and the fourth transistor 36 is a p-channel FET. The organic electroluminescent element 32 is a current-driven-type light-emitting element like a light-emitting diode, and is thus represented by a symbol indicating a diode.

A source of the first transistor 33 is connected to drains of the second to fourth transistors 34 to 36. A drain of the first transistor 33 is connected to a gate of the fourth transistor 36. The holding capacitor 37 is connected between a source and gate of the fourth transistor 36. The source of the fourth transistor 36 is also connected to a power supply voltage VOEL.

A source of the second transistor 34 is connected to the digital-to-analog converting circuit 61 in the data line driving circuit 60 via the data line Xm. The organic electroluminescent element 32 has an anode connected to a source of the third transistor 35, and a cathode connected to a ground.

Gates of the first transistor 33 and the second transistor 34 are commonly connected to a first sub-scanning line V1n constituting the scanning line Yn, to which a scanning signal SCln is input from the scanning line driving circuit 50. A gate of the third transistor 35 is connected to a second sub-scanning line V2n constituting the scanning line Yn, to which a scanning signal SC2n is input from the scanning line driving circuit 50.

The first transistor 33 and the second transistor 34 can be switching transistors that are used for storing an electric charge in the holding capacitor 37. The third transistor 35 is a switching transistor that is maintained in an ON state for an illumination period of the organic electroluminescent element 32. The fourth transistor 36 is a driving transistor for controlling the current flowing in the organic electroluminescent element 32. The current in the fourth transistor 36 is controlled by the amount of the electric charge stored in the holding capacitor 37.

Figure 4:
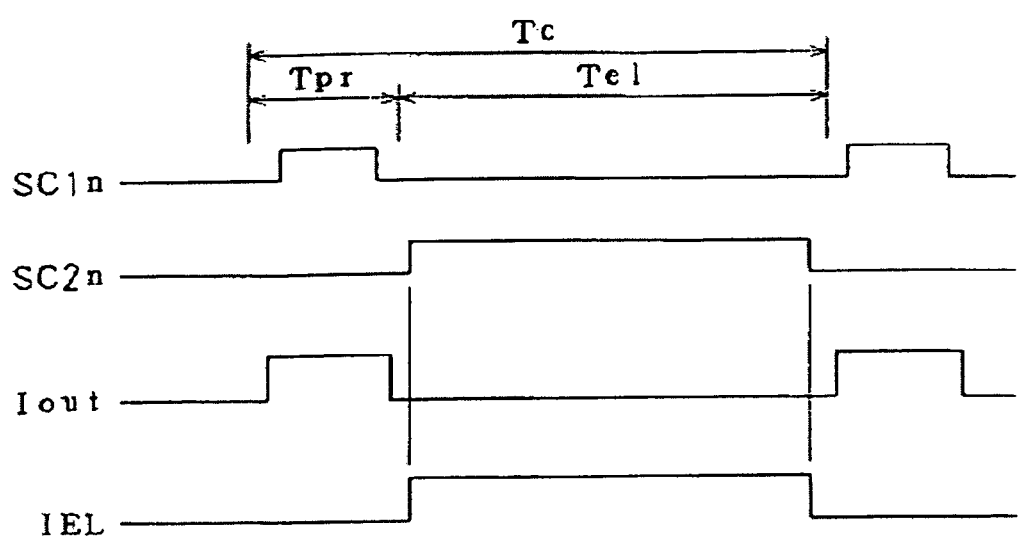
FIG. 4 is a timing chart showing the operation of the pixel circuit.

FIG. 4 is a timing chart showing the operation of the pixel circuit 31. FIG. 4 depicts the scanning signal SCln input via the first sub-scanning line V1n, the scanning signal SC2n input via the second sub-scanning line V2n, a data signal (analog current) Iout input via the data line Xm, and a current IEL flowing in the organic electroluminescent element 32.

Tc indicates the period of one frame for which a selection of a round of all scanning lines is completed. Tpr indicates the program period for which the luminescence intensity of the organic electroluminescent element 32 is set in the pixel circuit 31, which is determined by the scanning signal SC11nN input via the first sub-scanning line V1n. Tel indicates the illumination period for which the organic electroluminescent element 32 is illuminated, which is defined by the scanning signal SC2n input via the second sub-scanning line V2n.

In the programming period Tpr, the digital-to-analog converting circuit 61 in the data line driving circuit 60 outputs the data signal (analog current) Iout corresponding to the image data (grayscale data) onto the data line Xm, while the scanning line driving circuit 50 causes the scanning signal SC1n on the first sub-scanning line V1n to become high (H). Then, the first and second transistors 33 and 34 are turned on. The digital-to-analog converting circuit 61 in the data line driving circuit 60 can function as a constant current source for causing the analog current Iout corresponding to the grayscale data to flow. The holding capacitor 37 holds the electric charge corresponding to the analog current Iout. Then, the programming period Tpr terminates. As a result, the voltage stored in the holding capacitor 37 is retained between the source and gate of the fourth transistor 36.

When the programming period Tpr terminates, the scanning signal SCm becomes low (L), and the first transistor 33 and the second transistor 34 are turned off. The data line driving circuit 60 stops supplying the data signal (analog current) Iout to the pixel circuit.

In the illumination period Tel, the scanning line driving circuit 50 maintains the scanning signal SC1n at the L level so that the first and second transistors 33 and 34 are maintained in the OFF state, and causes the scanning signal SC2n on the second sub-scanning line V2n to become high (H) so that the third transistor 35 is turned on.

Since the electric charge corresponding to the data signal (analog current) Iout is stored in advance in the holding capacitor 37, substantially the same current as the analog current Iout flows in the fourth transistor 36, and this current (the current IEL) flows to the organic electroluminescent element 32 through the third transistor 35. For the illumination period Tel, therefore, the organic electroluminescent element 32 is illuminated with a luminance corresponding to the data signal (analog current) Iout.

The sensors 41 to 43 serving as detection sensors disposed in the detection area 40 will now be described. The temperature sensor 41 has a thermistor, and detects a change in the voltage due to a change in the operating environment, i.e., the temperature, to send the detected change as a temperature detection signal to the signal generating circuit 70. The ambient light sensor 42 has a photodiode, and detects the light intensity of the ambient light in the operating environment in terms of a current value to send the current value as an ambient light detection signal to the signal generating circuit 70. The deterioration sensor 43 is connected to dummy pixels, and detects a change in the voltage caused by deterioration in the operating environment of the dummy pixels to send the detected change as a deterioration signal to the signal generating circuit 70. The dummy pixels are pixels formed in the display panel 20 under the same conditions as those of the pixels 31 formed in the pixel area 30, and are driven under the same conditions as those of the pixels 31 in the pixel area 30.

The signal generating circuit 70 will now be described. The signal generating circuit 70 receives the detection signals from the sensors 41 to 43, and also receives digital image data (input grayscale data), clocks, and an energy-saving mode signal from external devices (not shown).

The signal generating circuit 70 converts the received digital image data (input grayscale data) into digital image data (output grayscale data) having a gamma characteristic so as to provide accurate color reproduction on the display panel 20.

The signal generating circuit 70 contains an LUT (Look Up Table), and this LUT is used for conversion into image data having a gamma characteristic.

Figures 5A, 5B:
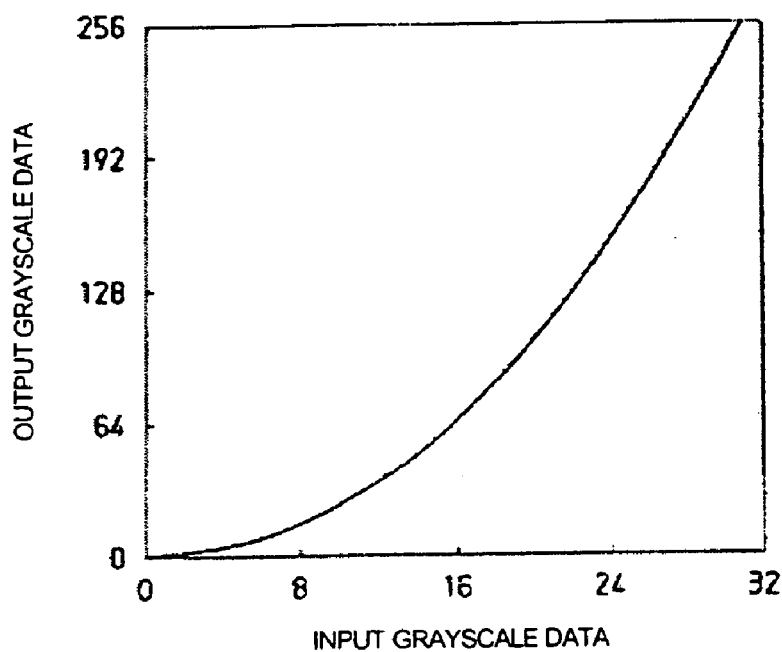
FIG. 5(a) is an LUT for providing a gamma characteristic for image data.
FIG. 5(b) is a graph thereof.

FIG. 5(a) is a conversion table showing an example of the LUT, and FIG. 5(b) is a graph (gamma curve) of the conversion table. Image data is input as 5-bit (32-grayscale) digital image data (input grayscale data), and is converted into 8-bit (256-grayscale) digital image data (output grayscale data) having a gamma characteristic with a gamma value of 2.2 in accordance with the LUT. The signal generating circuit 70 outputs the converted digital image data (output grayscale data) to the data line driving circuit 60. Throughout this document, the converted digital image data (output grayscale data) is also referred to simply as digital grayscale data.

Upon receiving clocks, the signal generating circuit 70 further generates a scanning line driving signal for sequentially selecting a pixel circuit set for one row based on the clock signal, and supplies the scanning line driving signal to the scanning line driving circuit 50. The signal generating circuit 70 generates a data line driving signal for determining a timing at which the data signal is supplied to the data lines Xm based on the clock signal, and supplies the data line driving signal to the data line driving circuit 60.

The signal generating circuit 70 also receives the detection signals from the sensors 41 to 43 and the energy-saving mode signal from an external device, and generates 8-bit current correction data based on the detection signals and the energy-saving mode signal.

The signal generating circuit 70 determines the temperature of the display panel 20 based on the temperature detection signal from the temperature sensor 41, and generates temperature correction data for the temperature of the display panel 20. The organic electroluminescent element 32 formed in the display panel unit 20 has a temperature characteristic in which the luminescence intensity varies as the temperature varies. Thus, even when a constant current IEL flows in the organic electroluminescent element 32, the luminescence intensity of the organic electroluminescent element 32 varies if the temperature varies.

Thus, the signal generating circuit 70 compensates for the luminescence intensity depending upon the temperature of the display panel 20 (the organic electroluminescent element 32). The signal generating circuit 70 generates temperature correction data for correcting the data signals output to the data lines Xm from the data line driving circuit 60 depending upon the detected temperature. In this embodiment, the temperature correction data is defined in advance for each temperature range, and is stored as 8-bit digital data in an internal memory of the signal generating circuit 70. The data corresponding to the detected temperature is then selected.

The signal generating circuit 70 determines the ambient luminance of the organic electroluminescent display device 10 based on the ambient light detection signal from the ambient light sensor 42, and generates ambient light correction data according to the ambient luminance. For example, when the ambient luminance is low, the luminance of the organic electroluminescent display device 10 is set lower (darker) than the standard luminescence intensity, thus allowing for low glare and leading to better visibility. On the other hand, when the ambient luminance is very high, the luminance of the organic electroluminescent display device 10 is set higher (brighter) than the standard luminescence intensity, thus allowing for better visibility.

Accordingly, the signal generating circuit 70 corrects for the luminescence intensity depending upon the ambient luminance so as to provide better visibility. The signal generating circuit 70 generates ambient light correction data for correcting the data signals output to the data lines Xm from the data line driving circuit 60 depending upon the ambient luminance. In this embodiment, the ambient light correction data is defined in advance for each luminance level, and is stored as 8-bit digital data in an internal memory of the signal generating circuit 70. The data corresponding to the detected luminance is then selected.

The signal generating circuit 70 determines the deterioration level of the organic electroluminescent element 32 based on the deterioration detection signal from the deterioration sensor 43, and generates deterioration correction data for the deterioration level. As the deterioration progresses, the luminescence intensity of the organic electroluminescent element 32 is lowered. Thus, even when a constant current IEL flows in the organic electroluminescent element 32, the luminescence intensity of the organic electroluminescent element 32 is lowered with progressive deterioration.

Thus, the signal generating circuit 70 compensates for the luminescence intensity depending upon the deterioration level of the organic electroluminescent element 32. The signal generating circuit 70 generates deterioration correction data for correcting the data signals output to the data lines Xm from the data line driving circuit 60 depending upon the detected deterioration level. In this embodiment, the deterioration correction data is defined in advance for each deterioration level, and is stored as 8-bit digital data in an internal memory of the signal generating circuit 70. The data corresponding to the detected deterioration level is then selected.

The signal generating circuit 70 generates energy-saving correction data for reducing the luminance of the organic electroluminescent display device 10 based on the energy-saving mode signal from an external device. The energy-saving mode signal is a control signal output from an external device for reducing the consumption power of the organic electroluminescent display device 10.

In response to the energy-saving mode signal, the signal generating circuit 70 generates energy-saving correction data for correcting the data signals output to the data lines Xm from the data line driving circuit 60. In this exemplary embodiment, the energy-saving correction data is defined in advance, and is stored as 8-bit digital data in an internal memory of the signal generating circuit 70. Thus, upon receiving the detection signals and the energy-saving mode signal, the signal generating circuit 70 determines the states of the organic electroluminescent display device 10 based on the signals. The signal generating circuit 70 reads the correction data stored in each memory depending upon the determined state, and outputs 8-bit current correction data (digital correction data) to the data line driving circuit 60.

The data line driving circuit 60 will now be described with reference to FIGS. 6 and 7. The data line driving circuit 60 includes digital-to-analog converting circuits 61 for the respective data lines Xm, and each digital-to-analog converting circuit 61 includes a first digital-to-analog converting circuit portion 62 and a second digital-to-analog converting circuit portion 63.

Figure 6:
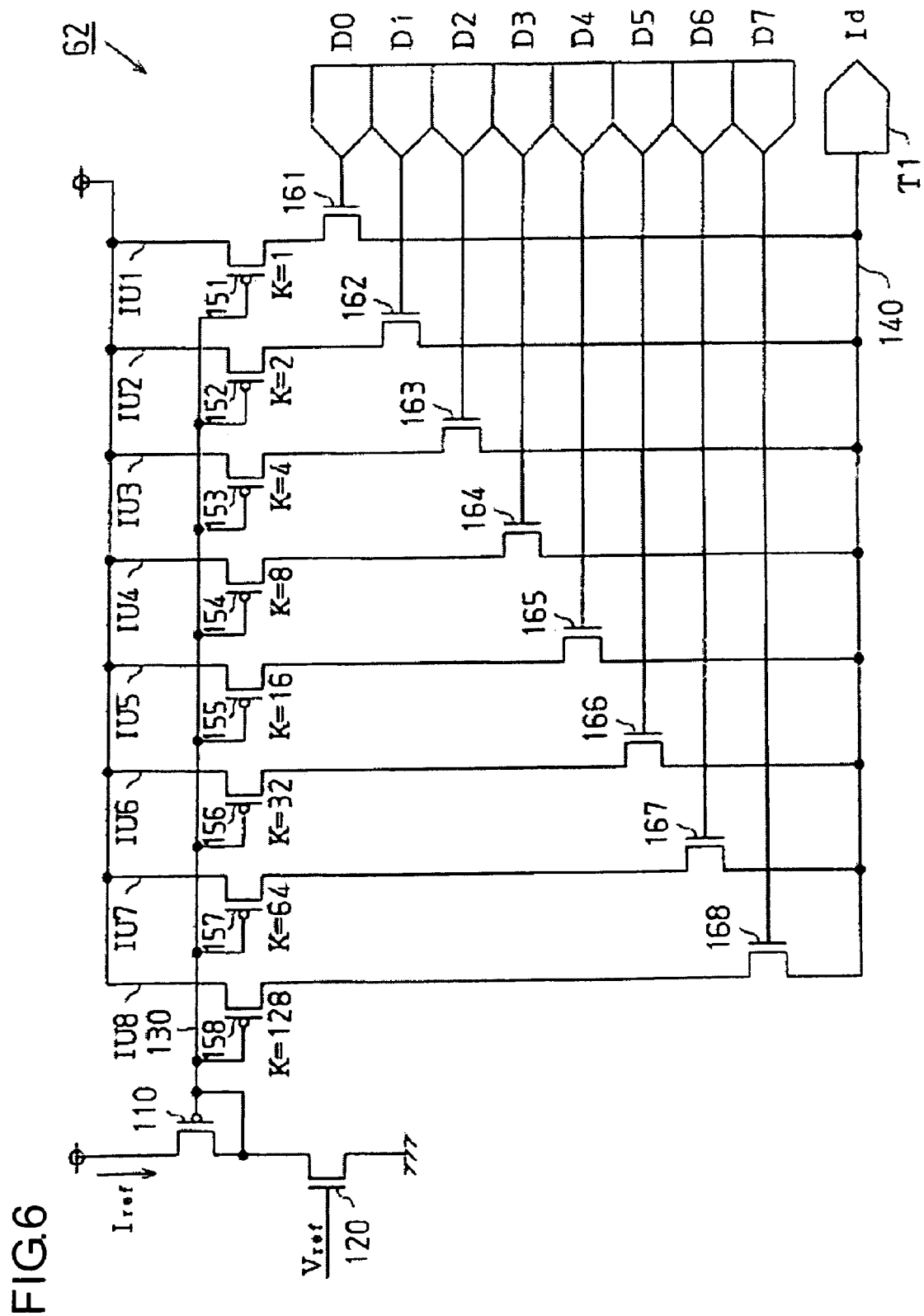
FIG. 6 is an exemplary circuit diagram showing the circuit structure of a first digital-to-analog converting circuit portion.

FIG. 6 is an exemplary circuit diagram of the first digital-to-analog converting circuit portion 62. A conversion transistor 110 (a first transistor) and a constant-current-source transistor 120 are connected in series between a power supply potential and a ground potential, and the constant-current-source transistor 120 is controlled by a control voltage Vref. The conversion transistor 110 is diode-connected, and a gate (first control terminal) of the conversion transistor 110 is connected to a common gate line 130. Eight current lines IU1 to IU8 are connected in parallel between the power supply potential and an output line 140 (first current path) connected to an output terminal T1 (first output terminal), and the common gate line 130 is connected to gates (second control terminals) of eight driving transistors 151 to 158 (second transistors) respectively connected to the eight current lines IU1 to IU8. Thus, the conversion transistor 110 and each of the eight driving transistors 151 to 158 constitute a current mirror circuit. Switching transistors 161 to 168 (third transistors) are connected in series to the eight driving transistors 151 to 158, respectively, and are connected to the output line 140. Bits D0 to D7 of the digital grayscale data (first digital data) having a gamma characteristic supplied from the signal generating circuit 70 are input to gates (third control terminals) of the eight switching transistors 161 to 168 via signal input lines, respectively.

In the example shown in FIG. 6, the constant-current-source transistor 120 and the switching transistors 161 to 168 are n-channel FETs, and the conversion transistor 110 and the driving transistors 151 to 158 are p-channel FETs.

The ratio K of gain factors $\beta$ of the eight driving transistors 151 to 158 is set to 1:2:4:8:16:32:64:128. The gain factor $\beta$ is defined by $\beta=K\beta0=(\mu CW/L)$, where K is a relative value, $\beta0$ is a predetermined constant, $\mu$ denotes the carrier mobility, C denotes the gate capacitance, W denotes the channel width, and L denotes the channel length. Since the current driving capability of a transistor is in proportion to the gain factor $\beta$, the ratio of the current driving capabilities of the eight driving transistors 151 to 158 is 1:2:4:8:16:32:64:128. The relative gain factor values K of the driving transistors 151 to 158 are set to values associated with weights of the bits D0 to D7 of the digital grayscale data.

In the first digital-to-analog converting circuit portion 62, when the control voltage Vref is input to the gate of the constant-current-source transistor 120, the constant-current-source transistor 120 is turned on in accordance with the voltage value of the control voltage Vref. Thus, the constant-current-source transistor 120 causes a reference current Iref corresponding to the gate-source voltage (control voltage Vref) to flow to the conversion transistor 110. When the 8-bit digital grayscale data is input from the signal generating circuit 70, a switching transistor is turned on by the grayscale data, and a current corresponding to the driving capability of the corresponding driving transistor flows to the current line of this switching transistor. The sum of the currents flowing in the current lines is in proportion to the input digital grayscale data, and an analog current Id (first analog current) is output from the output terminal T1 to the second digital-to-analog converting circuit portion 63 via the output line 140. Since the input digital grayscale data has a gamma characteristic, the output analog current Id also has a gamma characteristic.

In this embodiment, the gain factor of the conversion transistor 110 is equal to the gain factor (K=1) of the driving transistor 151 connected to the current line IU1. Since the conversion transistor 110 and each of the eight driving transistors 151 to 158 constitute a current mirror circuit, the output analog current Id has a current value that is at most 255 times the reference current Iref.

Figure 7:
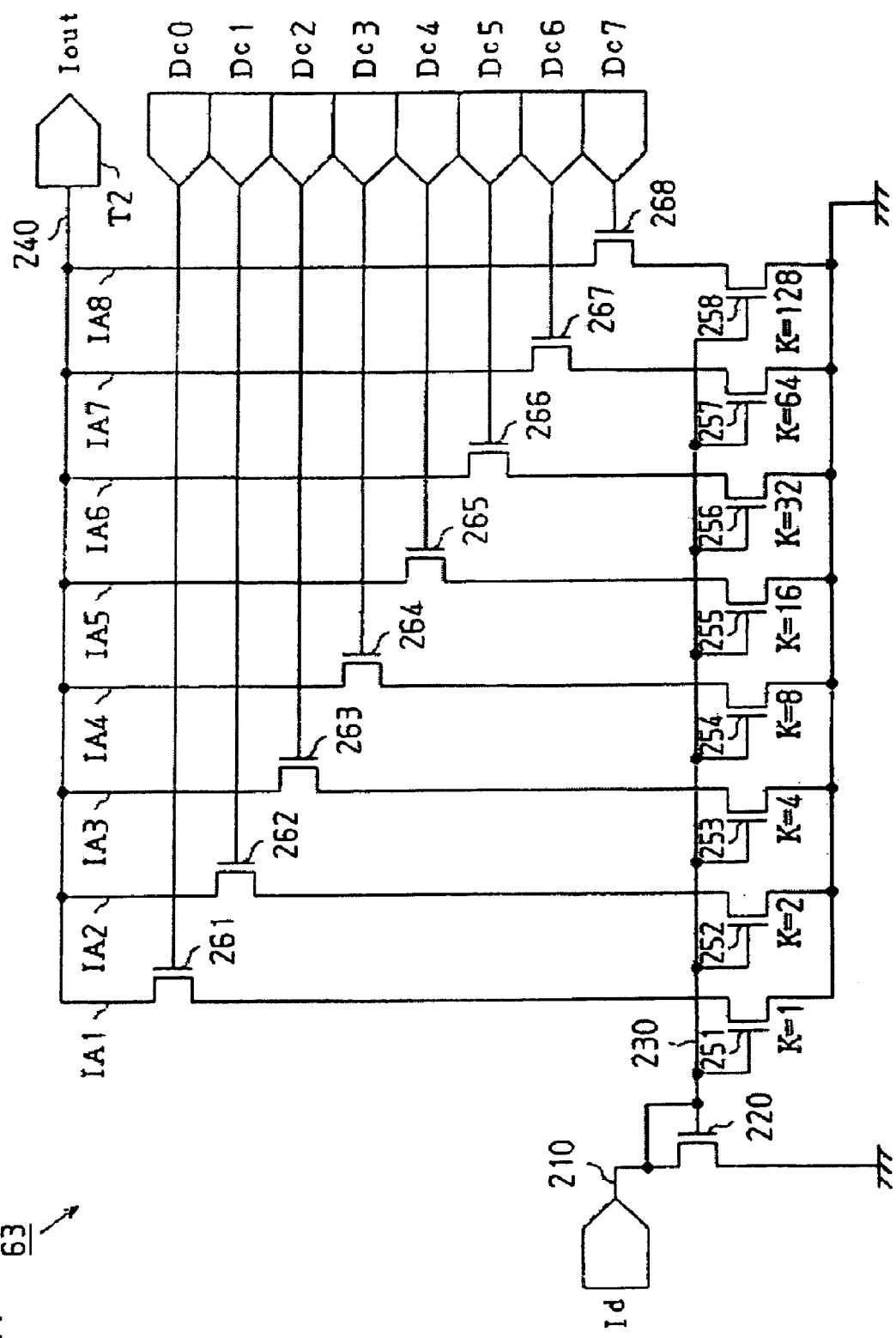
FIG. 7 is an exemplary circuit diagram showing the circuit structure of a second digital-to-analog converting circuit portion according to a first embodiment of the present invention.

FIG. 7 is an exemplary circuit diagram of the second digital-to-analog converting circuit portion 63.

An input line 210 is connected to the output terminal T1 of the first digital-to-analog converting circuit portion 62. A conversion transistor 220 (fourth transistor) is diode-connected between the input line 210 and a ground potential. A gate (fourth control terminal) of the conversion transistor 220 is connected to a common gate line 230. Eight current lines IA1 to IA8 are connected in parallel between the ground potential and an output line 240 (second current path) connected to an output terminal T2 (second output terminal), and the common gate line 230 is connected to gates (fifth control terminals) of eight driving transistors 251 to 258 (fifth transistors) respectively connected to the eight current lines IA1 to IA8. Thus, the conversion transistor 220 and each of the eight driving transistors 251 to 258 constitute a current mirror circuit. Switching transistors 261 to 268 (sixth transistors) are connected in series to the eight driving transistors 251 to 258, respectively, and are connected to the output line 240. Bits Dc0 to Dc7 of the 8-bit current correction data (second digital data) supplied from the signal generating circuit 70 are input to gates (sixth control terminals) of the eight switching transistors 261 to 268 via signal input lines, respectively.

The transistors shown in FIG. 7 are n-channel FETs. The ratio K of gain factors $\beta$ of the eight driving transistors 251 to 258 is set to 1:2:4:8:16:32:64:128. Since the current driving capability of a transistor is in proportion to the gain factor $\beta$, the ratio of the current driving capabilities of the eight driving transistors 251 to 258 is 1:2:4:8:16:32:64:128. The relative gain factor values K of the driving transistors 251 to 258 are set to values associated with weights of the bits Dc0 to Dc7 of the current correction data.

The second digital-to-analog converting circuit portion 63 receives the 8-bit current correction data from the signal generating circuit 70 when the analog current Id is input from the first digital-to-analog converting circuit portion 62 via the input line 210. A switching transistor is turned on by the current correction data, and a current corresponding to the driving capability of the corresponding driving transistor flows to the current line of this switching transistor. The sum of the currents flowing in the current lines becomes an analog current Iout (second analog current) obtained by correcting the analog current Id in accordance with the current correction data, and is then output as a data signal to the corresponding data line from the output terminal T2 via the output line 240.

In this embodiment, the gain factor of the conversion transistor 220 is equal to the gain factor (K=128) of the driving transistor 258 connected to the current line IA8. As described above, the conversion transistor 220 and each of the eight driving transistors 251 to 258 constitute a current mirror circuit. Thus, assuming that the 8-bit current correction data takes a value ranging from 1 to 255, a data signal (analog current) Iout that is obtained by correcting the value of the analog current Id with respect to the digital grayscale data within a range of 1/128 to about 2 times (255/128 times) can be generated.

The digital-to-analog converting circuit 61 is composed of the first digital-to-analog converting circuit portion 62 and the second digital-to-analog converting circuit portion 63 described above, and therefore has the functions as follows.

First, digital grayscale data (first digital data) having a gamma characteristic is input to the first digital-to-analog converting circuit portion 62 from the signal generating circuit 70, and digital current correction data (second digital data) based on the information detected by the sensors 41 to 43 is input to the second digital-to-analog converting circuit portion 63. Then, the first digital-to-analog converting circuit portion 62 converts the input digital grayscale data into an analog current Id (first analog current), and outputs the converted analog current Id to the second digital-to-analog converting circuit portion 63. The second digital-to-analog converting circuit portion 63 corrects the input analog current Id based on the digital current correction data, and outputs the corrected current as a data signal (analog current) Iout (second analog current) to the corresponding data line. This allows the digital-to-analog converting circuit 61 to correct the input digital grayscale data into a data signal (analog current) Iout so as to obtain the optimum luminescence intensity depending upon the ambient temperature, the ambient light, the deterioration level, etc., and to output the result.

As described above, according to the first exemplary embodiment, the following advantages can be achieved:

According to the first embodiment, the digital-to-analog converting circuit 61 disposed for each data line Xm includes the second digital-to-analog converting circuit portion 63. Therefore, after digital grayscale data is converted into an analog current Id, the analog current Id can be corrected into a data signal (analog current) Iout based on digital current correction data without any complex pre-processing.

According to the first embodiment, the second digital-to-analog converting circuit portion 63 disposed in the digital-to-analog converting circuit 61 is composed of current mirror circuits. Therefore, the analog current Id converted from the digital grayscale data can be readily corrected into a data signal (analog current) Iout.

According to the electrooptical device of the first embodiment, the analog current Id corresponding to image data (digital grayscale data) having a gamma characteristic is corrected by the second digital-to-analog converting circuit portion 63, thus allowing for grayscale correction without any complex processing while maintaining the gamma characteristic.

According to the first exemplary embodiment, the coefficient of grayscale correction (current correction data) is determined based on the information obtained by the sensors 41 to 43, thus achieving the optimum luminescence intensity depending upon the circumstance.

A second exemplary embodiment of the present invention will now be described with reference to FIG. 8. The feature of this embodiment is the second digital-to-analog converting circuit portion 63 in the digital-to-analog converting circuit 61, and, for convenience of illustration, only the second digital-to-analog converting circuit portion 63 will be described.

Figure 8A:
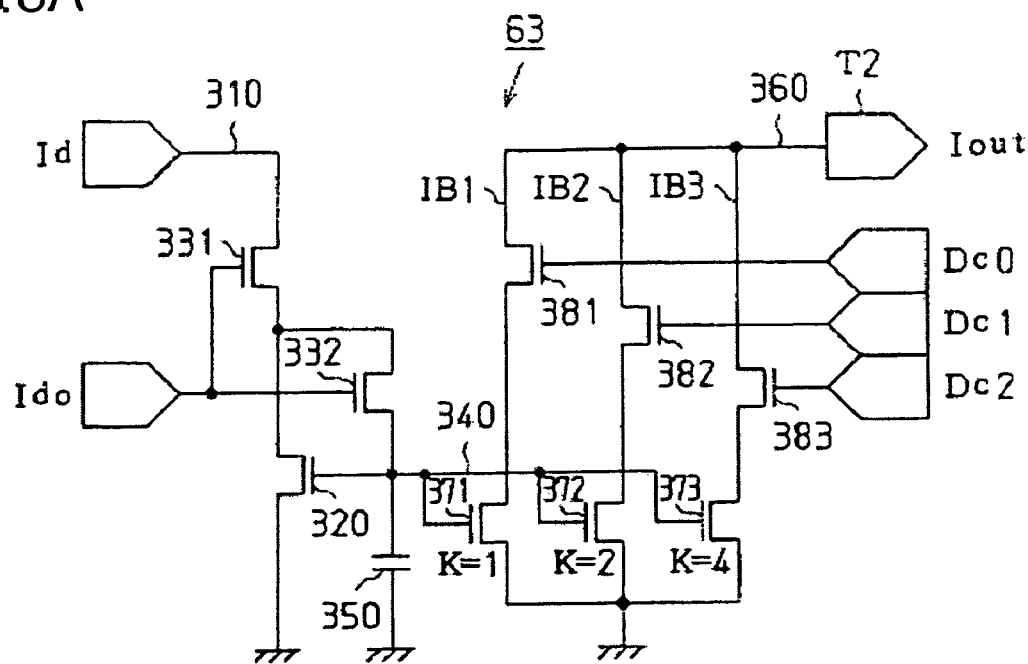
FIG. 8(a) is an exemplary circuit diagram showing the circuit structure of a second digital-to-analog converting circuit portion according to a second embodiment of the present invention.
Figure 8B:
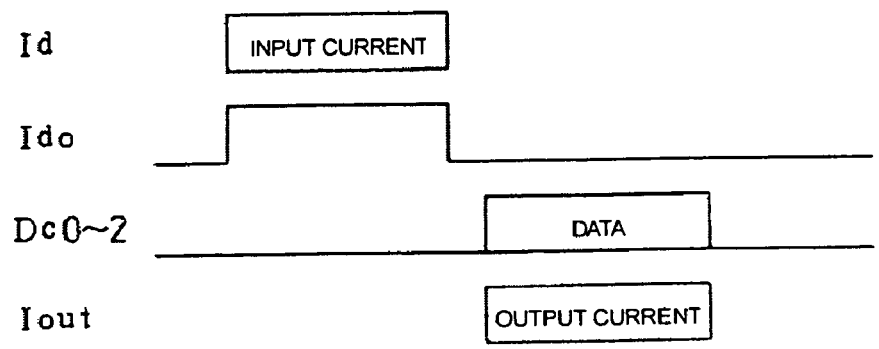
FIG. 8(b) is a timing chart thereof.

FIG. 8(a) is an exemplary circuit diagram of a second digital-to-analog converting circuit portion 63 in a digital-to-analog converting circuit 61 according to the second embodiment, and FIG. 8(b) is a timing chart of the second digital-to-analog converting circuit portion 63. In this embodiment, the current correction data is 3-bit digital data.

In FIG. 8(a), an input line 310 is connected to the output terminal T1 of the first digital-to-analog converting circuit portion 62, to which an analog current Id (first analog current) is supplied. A conversion transistor 320 (fourth transistor) and a switching transistor 331 (seventh transistor) are connected in series between a ground potential and the input line 310. A gate (fourth control terminal) and drain of the conversion transistor 320 are connected with each other via a switching transistor 332 (eighth transistor). A gate (seventh control terminal) of the switching transistor 331 and a gate (eighth control terminal) of the switching transistor 332 are connected with each other, to which a control signal Ido is input. In this embodiment, the control signal Ido is output from the signal generating circuit 70 of the first embodiment to the second digital-to-analog converting circuit portions 63 disposed for the respective data lines Xm, and is output to the second digital-to-analog converting circuit portions 63 according to a predetermined order.

The gate (fourth control terminal) of the conversion transistor 320 is also connected to a common gate line 340, and a holding capacitor 350 (first capacitor) is connected between the gate of the conversion transistor 320 and the ground potential. Three current lines 1131 to 11B3 are connected in parallel between the ground potential and an output line 360 (second current path) connected to an output terminal T2 (second output terminal), and the three current lines IB1 to IB3 are connected to driving transistors 371 to 373 (fifth transistors), respectively. Gates (fifth control terminals) of the driving transistors 371 to 373 are connected to the gate of the conversion transistor 320 via the common gate line 340.

Thus, when the switching transistors 331 and 332 are turned on by the control signal Ido, the gate and drain of the conversion transistor 320 are conducted to each other, and the conversion transistor 320 and each of the three driving transistors 371 to 373 constitute a current mirror circuit. Switching transistors 381 to 383 (sixth transistors) are connected in series to the three driving transistors 371 to 373, respectively, and are connected to the output line 360. Bits Dc0 to Dc2 of the current correction data (second digital data) supplied from the signal generating circuit 70 are input to gates (sixth control terminals) of the three switching transistors 381 to 383 via signal input lines, respectively.

The transistors shown in FIG. 8(a) are n-channel FETs. The ratio K of gain factors β of the three driving transistors 371 to 373 is set to 1:2:4. Since the current driving capability of a transistor is in proportion to the gain factor β, the ratio of the current driving capabilities of the three driving transistors 371 to 373 is 1:2:4. The relative gain factor values K of the driving transistors 371 to 373 are set to values associated with weights of the bits Dc0 to Dc2 of the current correction data.

As shown in FIG. 8(b), when an H-level control signal Ido is input to the first digital-to-analog converting circuit portion 62, the two switching transistors 331 and 332 are turned on. Then, the analog current Id corresponding to the digital grayscale data is supplied from the first digital-to-analog converting circuit portion 62 to the input line 310. Concurrently, the gate voltage corresponding to the analog current Id caused by the conversion transistor 320 to flow is stored in the holding capacitor 350. This allows the three driving transistors 371 to 373 to also drive the currents in proportion to the value of the analog current Id.

As shown in FIG. 8(b), when the control signal Ido falls to the L level to turn off the two switching transistors 331 and 332, the bits Dc0 to Dc2 of the current correction data are input from the signal generating circuit 70 to the gates of the switching transistors 381 to 383. Then, a switching transistor is turned on by the current correction data, and a current corresponding to the driving capability of the corresponding driving transistor flows to the current line of this switching transistor. Then, the sum of the currents flowing in the current lines is output as a data signal (analog current) Iout (second analog current) corrected based on the current correction data to the corresponding data line from the output terminal T2 via the output line 360.

In this embodiment, the gain factor of the conversion transistor 320 is equal to the gain factor (K=4) of the driving transistor 373 connected to the current line IB3. As described above, the conversion transistor 320 and each of the three driving transistors 371 to 373 constitute a current mirror circuit. Thus, assuming that the current correction data takes a value ranging from 1 to 7, the value of the analog current Id with respect to the digital grayscale data can be corrected within a range of 1/4 to 7/4 times.

In the first exemplary embodiment, in order to output the data signal (analog current) Iout from the second digital-to-analog converting circuit portion 63, the analog current Id is output from the first digital-to-analog converting circuit portion 62 for a writing period. In the second embodiment, however, the holding capacitor 350 is provided, and therefore the supply of the analog current Id can be stopped when the holding capacitor 350 holds the voltage corresponding to the analog current Id.

This can be achieved by connecting the second digital-to-analog converting circuit portions 63 of the second embodiment disposed for the respective data lines Xm to a single first digital-to-analog converting circuit portion 62. Specifically, the single first digital-to-analog converting circuit portion 62 sequentially generates analog currents for the second digital-to-analog converting circuit portions 63 disposed for the respective data lines. When an analog current Id for one of the second digital-to-analog converting circuit portions 63 is generated, the control signal Ido is output to this second digital-to-analog converting circuit portion 63 to supply the generated analog current Id. Then, the first digital-to-analog converting circuit portion 62 generates an analog current Id for the subsequent one of the second digital-to-analog converting circuit portions 63, and likewise outputs the control signal Ido to this second digital-to-analog converting circuit portion 63 to supply the generated analog current Id. By repeating the same operation on the subsequent second digital-to-analog converting circuit portions 63, the single first digital-to-analog converting circuit portion 62 can be used to supply analog currents Id to the plurality of second digital-to-analog converting circuit portions 63 disposed for the respective data lines Xm.

As described above, according to the second exemplary embodiment, in addition to the above-described advantages of the first exemplary embodiment, the following advantage can be achieved. According to the second exemplary embodiment, a single first digital-to-analog converting circuit portion 62 can be shared by a plurality of second digital-to-analog converting circuit portions 63, thus reducing the number of first digital-to-analog converting circuit portions 62 that require a relatively large space. Therefore, the structure of the data line driving circuit 60 can be simple, and the size of the overall device can be reduced.

A third exemplary embodiment of the present invention will now be described with reference to FIG. 9. The feature of this embodiment is the second digital-to-analog converting circuit portion 63 in the digital-to-analog converting circuit 61, and, for convenience of illustration, only the second digital-to-analog converting circuit portion 63 will be described.

Figure 9A:
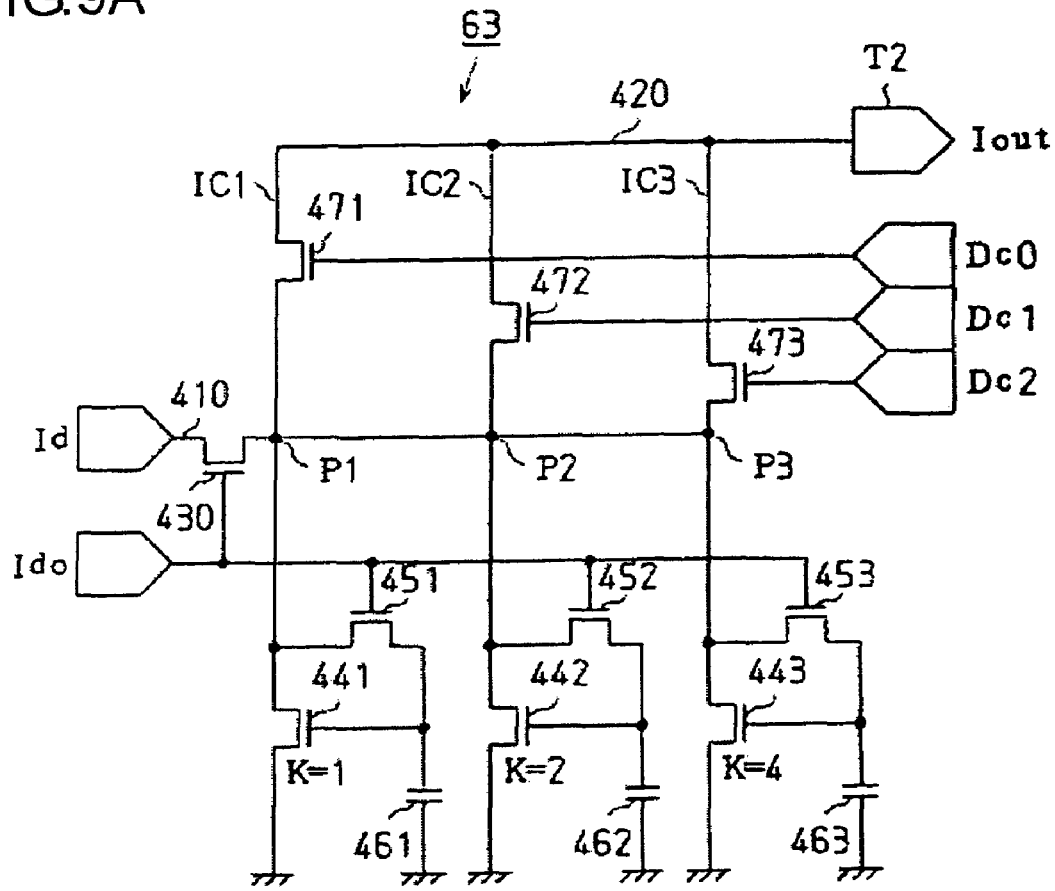
FIG. 9(a) is an exemplary circuit diagram showing the circuit structure of a second digital-to-analog converting circuit portion according to a third embodiment of the present invention.
Figure 9B:
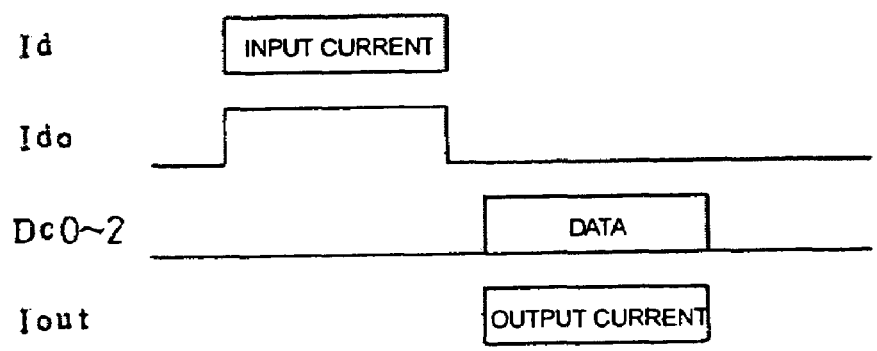
FIG. 9(b) is a timing chart thereof.

FIG. 9(*a*) is an exemplary circuit diagram of a second digital-to-analog converting circuit portion 63 serving as a correction circuit portion in a digital-to-analog converting circuit 61 according to the third embodiment, and FIG. 9(*b*) is a timing chart of the second digital-to-analog converting circuit portion 63. In this embodiment, the current correction data is 3-bit data as in the second embodiment.

In FIG. 9(*a*), an input line 410 can be connected to the output terminal T1 of the first digital-to-analog converting circuit portion 62, to which an analog current Id (first analog current) is supplied. Three current lines IC1 to IC3 are connected in parallel between a ground potential and an output line 420 (second current path) connected to an output terminal T2 (second output terminal). The input line 410 can be connected to the three current lines IC1 to IC3 via a switching transistor 430 (eleventh transistor), and driving transistors 441 to 443 (ninth transistors) are connected between the ground potential and nodes P1, P2, and P3 of the input line 410 and the three current lines IC1 to IC3, respectively. Gates (ninth control terminals) of the driving transistors 441 to 443 are connected to drains of the driving transistors 441 to 443 via switching transistors 451 to 453 (twelfth transistors), respectively, and holding capacitors 461 to 463 (second capacitors) are connected between the ground potential and the gates of the driving transistors 441 to 443, respectively.

A gate (eleventh control terminal) of the switching transistor 430 and gates (twelfth control terminals) of the switching transistors 451 to 453 are connected with each other, to which the control signal Ido described above in the second embodiment is input. Three switching transistors 471 to 473 (tenth transistors) are connected between the output line 420 and the three nodes P1, P2, and P3 on the three current lines IC1 to IC3, and are connected in series to the driving transistors 451 to 453, respectively. Bits Dc0 to Dc2 of the current correction data (second digital data) supplied from the signal generating circuit 70 are input to gates (tenth control terminals) of the three switching transistors 471 to 473 via signal input lines, respectively.

The transistors shown in FIG. 9(*a*) are n-channel FETs. The ratio K of gain factors β of the three driving transistors 441 to 443 is set to 1:2:4. Since the current driving capability of a transistor is in proportion to the gain factor β, the ratio of the current driving capabilities of the three driving transistors 441 to 443 is 1:2:4. The relative gain factor values K of the driving transistors 441 to 443 are set to values associated with weights of the bits Dc0 to Dc2 of the current correction data.

As shown in FIG. 9(*b*), when an H-level control signal Ido is input to the second digital-to-analog converting circuit portion 63, the four switching transistors 430 and 451 to 453 are turned on. When the four switching transistors 430 and 451 to 453 are turned on, the analog current Id corresponding to the digital grayscale data is supplied from the first digital-to-analog converting circuit portion 62 to the input line 410 of the second digital-to-analog converting circuit portion 63. The analog current Id is distributed in proportion corresponding to the current driving capabilities of the three driving transistors 441 to 443, and the gate voltages corresponding to the distributed currents are concurrently held in the three holding capacitors 461 to 463.

As shown in FIG. 9(*b*), when the control signal Ido falls to the L level, the four switching transistors 430 and 451 to 453 are turned off. When the four switching transistors 430 and 451 to 453 are turned off, the bits Dc0 to Dc2 of the current correction data are input from the signal generating circuit 70.

Then, a switching transistor is turned on by the current correction data, and a current substantially equal to the distributed currents flows to the current line of this switching transistor. Then, the sum of the currents flowing in the current lines is output as a data signal (analog current) Iout (second analog current) corrected based on the current correction data to the corresponding data line from the output terminal T2 via the output line 420. In this case, the value of the analog current Id with respect to the digital grayscale data can be corrected within a range of 1/7 to 1 time.

Therefore, like the second exemplary embodiment, the second digital-to-analog converting circuit portions 63 disposed for the respective data lines Xm can be connected to a single first digital-to-analog converting circuit portion 62, and analog currents Id are sequentially supplied from the single first digital-to-analog converting circuit portion 62 to the second digital-to-analog converting circuit portions 63 based on the control signal Ido.

As described above, according to the third exemplary embodiment, the same above-described advantages as the advantages of the foregoing embodiments can be achieved.

An application of the organic electroluminescent display device 10 described above in the first to third exemplary embodiments to an electronic apparatus will now be described with reference to FIG. 10. The organic electroluminescent display device 10 can be used for a variety of electronic apparatuses including a portable telephone, a portable information device, a digital camera, and so forth.

Figure 10:
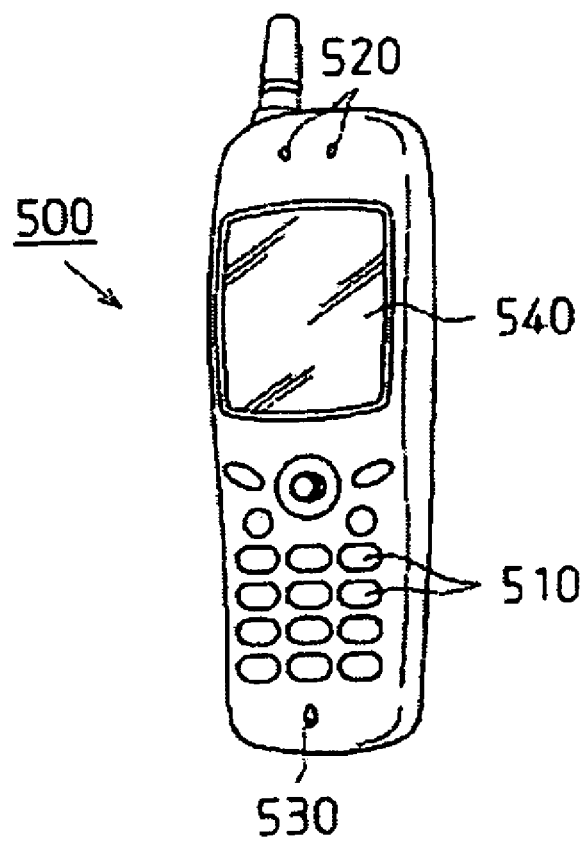
FIG. 10 is a perspective view showing the structure of a portable telephone.

FIG. 10 is a perspective view of a portable telephone. In FIG. 10, a portable telephone 500 can include a plurality of operation buttons 510, an earpiece 520, a mouthpiece 530, and a display unit 540 using the organic electroluminescent display device 10 of the illustrated embodiments. Also in this case, the display unit 540 formed of the organic electroluminescent display device 10 achieves the same advantages as those of the illustrated exemplary embodiments. Therefore, the portable telephone 500 can achieve image display capable of grayscale correction while maintaining a gamma characteristic.

The illustrated embodiments of the invention may be modified in the following manner.

In the illustrated embodiments, the second digital data, or the digital correction data, is data that is based on the operating state or operating environment of the organic electroluminescent display device or a control signal from an external device. The second digital data, or the digital correction data, may be applied to digital correction data for peak luminance control based on image data. For example, the organic electroluminescent display device includes a memory for at least one frame, and, for example, the signal generating circuit 70 determines the total luminance for one frame from the image data for one frame stored in this memory. When the determined total luminance is over a predetermined reference value, the signal generating circuit 70 generates digital correction data so that the analog current Iout serving as the second analog current is lower than the first analog current (analog current Id). On the other hand, when the determined total luminance is not greater than the predetermined reference value, the signal generating circuit 70 generates digital correction data so that the analog current Iout serving as the second analog current is higher than the first analog current (analog current Id). The present invention is therefore suitably applicable for peak luminance control based on image data.

In the illustrated embodiments, in the second digital-to-analog converting circuit portion 63 shown in FIG. 7, the eight driving transistors 251 to 258 are provided, and the ratio K of the gain factors $\beta$ of the driving transistors 251 to 258 is set to 1:2:4:8:16:32:64:128. The 8-bit current correction data can take a value ranging from 1 to 255. For example, the number of driving transistors is five, and the ratio K of gain factors $\beta$ of the five driving transistors is set to 1:2:4:8:128. The driving transistor of which the ratio K of the gain factor $\beta$ is 128 may always be in the ON state, while the remaining four driving transistors of which the ratio K of the gain factors $\beta$ is 1:2:4:8 may be turned on and off. In this case, the current correction data can take a value ranging from 128 to 143. Thus, if the output current (analog current Id) need not be corrected within a large range or if high-accuracy correction within a limited range is only required, advantageously, the above-described object can be achieved with a small space.

In the illustrated embodiments, grayscale data is used as the first digital data, and current correction data is used as the second digital data; however, the first digital data and the second digital data are not limited to such data. For example, current correction data may be handled as the first digital data, and grayscale data may be handled as the second digital data. In another combination, a portion of the first digital data or a portion of the second digital data may be handled as current correction data, and the remaining digital data may be handled as grayscale data, or vice versa.

In the illustrated embodiments, a conversion transistor and a driving transistor in the first digital-to-analog converting circuit portion 62 or the second digital-to-analog converting circuit portion 63 constitute a simple current mirror circuit, or may constitute a cascode current mirror circuit, a Wilson current mirror circuit, a wide-amplitude current mirror circuit, or any other current mirror circuit.

In the illustrated embodiments, the sensors 41 to 43 are provided as detection sensors; however, a virtual detection sensor may be used. For example, cumulative illumination time or the like may be stored, from which progressive deterioration is predicted to produce deterioration information. Therefore, no additional component or circuit is required as detection means for correction according to the situation.

In the illustrated embodiments, the current correction data is the same data for all pixels. However, different data may be used from one pixel to another. For example, when different characteristics are exhibited depending upon the illuminated color, different current correction data from one illuminated color to another may be used. This allows for detailed correction depending upon the illuminated color, the pixel position, etc. Moreover, variations in the initial characteristics of pixels, e.g., variations in a current characteristic of electroluminescent elements, variations in an injection current characteristic to electroluminescent elements with respect to input currents to pixel circuits (TFTs), etc, can also be compensated for. Moreover, variations in the deterioration of pixels can also be compensated for. In this case, the deterioration level for each pixel must be monitored by a sensor or the like.

In the second and third exemplary embodiments, a single first digital-to-analog converting circuit portion 62 is connected to all second digital-to-analog converting circuit portions 63. A plurality of first digital-to-analog converting circuit portions 62 may be connected to a plurality of second digital-to-analog converting circuit portions 63.

While this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. An electrooptical device provided with a plurality of scanning lines, a plurality of data lines, electrooptical elements respectively disposed at intersections of the respective scanning lines and the respective data lines, and a data line drive circuit that supplies an analog current to the respective data lines, wherein:

the data line drive circuit includes:
a first digital-analog converting circuit portion that inputs first digital data and converts the first digital data to a first analog current; and
a second digital-analog converting circuit portion that inputs second digital data, corrects the first analog current outputting from the first digital-analog converting circuit portion based on the second digital data, and outputs it as a second analog current; and the first digital-analog converting circuit portion includes:
a plurality of drive transistors that are driven based on a current that becomes a reference; and
a plurality of switching transistors that are series-connected to the plurality of drive transistors, wherein:
based on the first digital data, the plurality of switching transistors are selected, currents output from the drive transistors that correspond to the selected switching transistors, respectively, are added and output as the first analog current to the second digital-analog converting circuit portion.

2. The electrooptical device as set forth in claim 1, wherein the plurality of drive transistors are constituted so that a relative value of a gain coefficient of an nth (n is a natural number) transistor among the plurality of drive transistors becomes $2n-1$.

3. The electrooptical device as set forth in claim 1, further comprising:
   an ambient light sensor that detects ambient light; and
   a control circuit that corrects the second digital data based on a detection signal from the ambient light sensor.

4. The electrooptical device as set forth in claim 1, further comprising:
   a temperature sensor that detects a surrounding temperature; and
   a control circuit that corrects the second digital data based on a detection signal from the temperature sensor.

5. The electrooptical device as set forth in claim 1, further comprising:
   a memory that stores an accumulated light emitting time of the electrooptical element; and
   a control circuit that corrects the second digital data based on the accumulated light emitting time stored in the memory.

6. The electrooptical device as set forth in claim 1, further comprising:
   a memory that stores one frame of image data; and
   a control circuit that calculates one frame of the overall brightness from one frame of image data stored in the memory and corrects the second digital data based on the calculated overall brightness.

7. The electrooptical device as set forth in claim 6,
   wherein when the calculated overall brightness exceeds a predetermined reference value, the second digital data is corrected so that the second analog current becomes smaller than the first analog current, and when the calculated overall brightness is less than or equal to a predetermined reference value, the second digital data is corrected so that the second analog current becomes larger than the first analog current.

8. The electrooptical device as set forth in claim 1,
   wherein the electrooptical element is an electroluminescence element.

9. An electronic device, comprising:
   the electrooptical element as set forth in claim 1.

* * * * *